(12) United States Patent
Iguchi

(10) Patent No.: US 6,558,982 B1
(45) Date of Patent: May 6, 2003

(54) SEMICONDUCTOR DEVICE MANUFACTURING METHOD AND MOLD DIE

(75) Inventor: Akihisa Iguchi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/461,287

(22) Filed: Dec. 15, 1999

(30) Foreign Application Priority Data

Jul. 5, 1999  (JP) .......................................... 11-190758

(51) Int. Cl.[7] .......................... H01L 21/44; H01L 23/34
(52) U.S. Cl. ...................... 438/127; 438/117; 438/112; 438/124; 438/126; 257/727; 257/787
(58) Field of Search ................................ 438/117, 112, 438/124, 125, 126, 127; 257/726, 727, 737, 780, 787

(56) References Cited

U.S. PATENT DOCUMENTS

| | | | |
|---|---|---|---|
| 5,817,545 A | * 10/1998 | Wang et al. | ................ 438/126 |
| 5,874,324 A | * 2/1999 | Osada | ........................ 438/127 |
| 5,998,243 A | * 12/1999 | Odashima et al. | ........... 438/126 |
| 6,204,095 B1 | * 3/2001 | Farnworth | ................... 438/127 |
| 6,329,224 B1 | * 12/2001 | Nguyen et al. | ............. 438/127 |
| 6,335,221 B1 | * 1/2002 | Mess | .......................... 438/126 |

* cited by examiner

*Primary Examiner*—Kevin M. Picardat
(74) *Attorney, Agent, or Firm*—Rabin & Berdo, PC

(57) ABSTRACT

A semiconductor device manufacturing method and a mold die that make it possible to expose the upper portions of external terminals with ease without having to implement a polishing process, are provided. The semiconductor device manufacturing method comprises a step in which external terminals are formed as bumps on a semiconductor element substrate, a step in which the semiconductor element substrate is mounted on the upper surface of a lower die of a mold die comprising an upper die and the lower die that is used to seal the semiconductor element substrate in resin, a step in which a tape is placed over the area of the upper surface of the lower die where the semiconductor element substrate is mounted and a step in which the upper die is placed in close contact with the external terminals. By employing this manufacturing method, it is possible to control the clamping force of the mold die. Thus, even when the upper die of the mold die is placed in close contact with the external terminals, deformation of the external terminals and damage to the semiconductor element do not occur. As a result, a polishing process for exposing the external terminals can be omitted and an improvement in yield is achieved.

9 Claims, 3 Drawing Sheets

SEMICONDUCTOR DEVICE MANUFACTURING METHOD AND MOLD DIE

BACKGROUND OF THE INVENTION

The present invention relates to a semiconductor device manufacturing method and a mold die.

During a process for manufacturing a semiconductor device, a mold die is employed to seal the semiconductor device with resin in order to assure that its external shape is maintained and that the required degree of moisture resistance is achieved. Such resin-sealed semiconductor devices are sometimes held and connected by a lead frame or a substrate. However, a structure that uses a lead frame or a substrate is bound to result in the overall size of the semiconductor device becoming excessively large compared to the size of the semiconductor element itself. Therefore, in recent years, external terminals have been provided as bumps on the semiconductor element substrate.

PRIOR ART

The following is an explanation of a semiconductor device manufacturing method in the prior art that is implemented by providing external terminals as bumps on the semiconductor element substrate.

External terminals are formed as bumps on a semiconductor element substrate on which semiconductor elements are formed. This semiconductor element substrate is mounted on a mold die comprising an upper die and a lower die, and is sealed with resin covering the external terminals, by injecting the sealing resin through a sealing resin intake formed at a specific position.

As a means for ensuring that the upper portions of the external terminals are exposed from the sealing resin to allow electrical connection of the external terminals, the upper die may be placed in close contact with the external terminals to prevent the external terminal upper portions from becoming covered by the sealing resin. However, it is not desirable to place the upper die in close contact with the external terminals since this will result in an excessive degree of clamping force applied to the semiconductor element substrate where the external terminals are formed to cause deformation of the external terminals and damage to the semiconductor element.

For this reason, during the resin sealing process, the upper portions of the external terminals are temporarily covered by the sealing resin, and then the upper portions of the external terminals are exposed in a subsequent polishing process. Thus, in the semiconductor device manufacturing method of the prior art for manufacturing a resin-sealed semiconductor device, the polishing process, as well as the resin sealing process, is essential, and the inclusion of the polishing process in the manufacturing method results in an increase in production costs due to a greater number of processes to be implemented and a reduction in yield caused by deformation of the external terminals and damage to the semiconductor element.

SUMMARY OF THE INVENTION

An object of the present invention, which has been completed by addressing the problems of the semiconductor device in the prior art discussed above, is to provide a new and improved semiconductor device manufacturing method and a new and improved mold die, that make it possible to expose the upper portions of external terminals with a high degree of ease without having to implement a polishing process.

In order to achieve the object described above, the semiconductor device manufacturing method according to the present invention comprises a step in which external terminals are formed as bumps on a semiconductor element substrate, a step in which the semiconductor element substrate is mounted on an upper surface of a lower die of a mold die comprising an upper die and the lower die that is employed to seal the semiconductor element substrate with a resin, a step in which a cushioning member is placed over the area of the upper surface of the lower die where the semiconductor element substrate is mounted and a step in which the upper die is placed in close contact with the external terminals.

Alternatively, the semiconductor device manufacturing method according to the present invention comprises a step in which external terminals are formed as bumps on a semiconductor element substrate, a step in which the semiconductor element substrate is mounted on an upper surface of a lower die of a mold die comprising an upper die and the lower die, that is employed to seal the semiconductor element substrate with a resin and a step in which the upper die is placed in close contact with the external terminals by sliding the upper die and/or the lower die along the direction of the height of the semiconductor element substrate.

In addition, the mold die according to the present invention, which comprises an upper die and a lower die used to seal in resin a semiconductor element substrate having external terminals formed as bumps, is characterized in that a cushioning member is provided to absorb the clamping force imparted by the upper die and the lower die in the area of an upper surface of the lower die where the semiconductor element substrate is mounted.

Another mold die according to the present invention, which comprises an upper die and a lower die used to seal in resin a semiconductor element substrate having external terminals formed as bumps, is characterized in that the upper die and/or the lower die is provided with a sliding mechanism that slides in relation to the direction of the height of the semiconductor element substrate.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

Figure 1A:
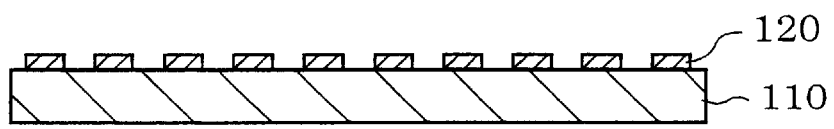
FIG. 1 illustrates the semiconductor device manufacturing method in a first embodiment.

The following is a detailed explanation of the preferred embodiments of the semiconductor device manufacturing method and the mold die according to the present invention, given in reference to the attached drawings. It is to be noted that in the specification and the drawings, the same reference numbers are assigned components assuming essentially the same functions and structural features to preclude the necessity for a repeated explanation thereof. First Embodiment The semiconductor device manufacturing method in the first embodiment is now explained in reference to FIG. 1. In the semiconductor device manufacturing method in this embodiment, a mold die comprising an upper die 130 and a lower die 135, as illustrated in FIG. 1 is employed. At the mold die, a tape 150 constituting a cushioning member is placed over the area of the upper surface of the lower die 135 where the semiconductor element substrate 110 is mounted, to absorb the clamping force imparted by the upper die 130 and the lower die 135.

The cushioning member provided to absorb the clamping force is not restricted to be constituted of tape, and may be constituted of plastic foam, a spring, an excelsior, paper padding, wadding, corrugated fiber board, felt, a molded valve an air-filled pad or the like instead. The material constituting the cushioning member and its thickness may be varied as necessary in correspondence to the required resistance to an external force at the semiconductor element substrate 110 and external terminals 120.

Figure 1B:
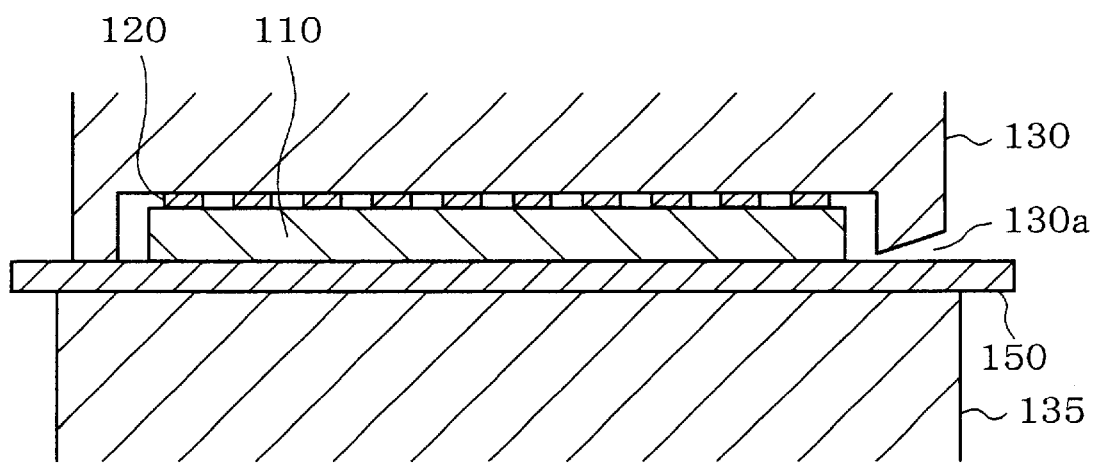

Next, the semiconductor device manufacturing method implemented by using the mold die described above is explained in reference to FIG. 1. On the semiconductor element substrate 110, the external terminals 120 are formed as bumps, as illustrated in FIG. 1(A). This semiconductor element substrate 110 is mounted on the upper surface of the lower die 135 of the mold die, as illustrated in FIG. 1(B). The tape 150 described above has been placed over the area of the upper surface of the lower die 135 at the mold die where the semiconductor element substrate 110 is mounted.

In this embodiment, the tape 150 functioning as a cushioning member for absorbing the clamping force of the mold die is provided. Thus, even when the upper die 130 of the mold die is placed in close contact with the external terminals 120, the semiconductor element substrate 110 where the external terminals 120 are formed does not bear an excessively large load from the crimping force and, consequently, deformation of the external terminals 120 and damage to the semiconductor element are prevented.

Figure 1C:
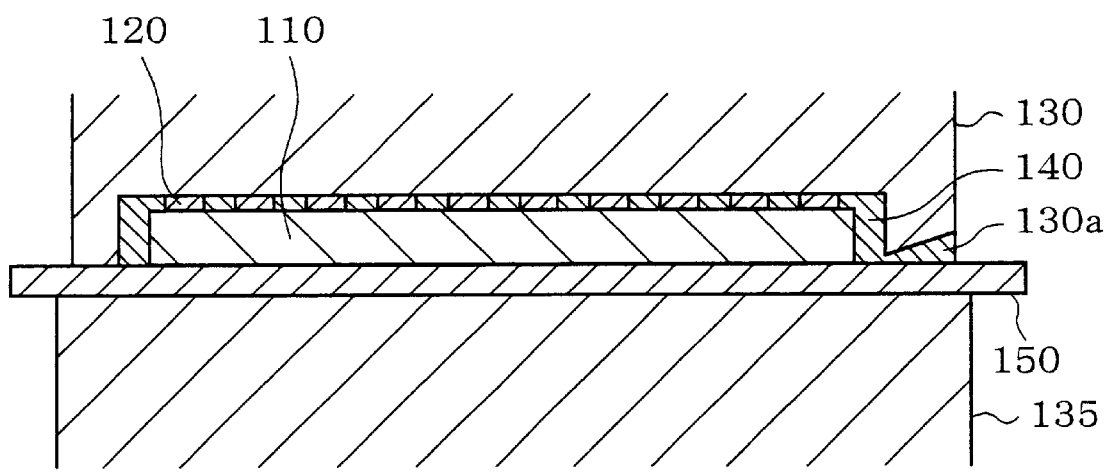
Figure 1D:
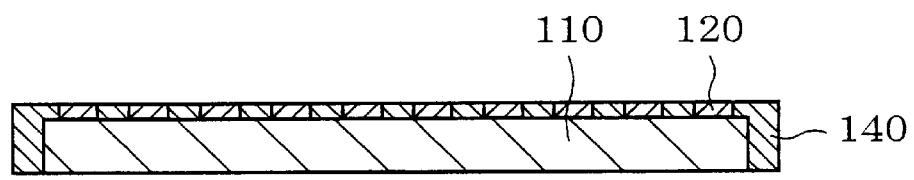

Next, as illustrated in FIG. 1(C), a sealing resin 140 is injected through a sealing resin intake 130a formed at a specific position of the mold die 130. At this point, since the upper die 130 is placed in close contact with the external terminals 120, the sealing resin 140 that is injected does not cover the upper portions of the external terminals 120.

At the semiconductor element substrate 110 taken out of the mold die when the resin sealing is completed, the upper portions of the external terminals 120 are not covered with resin and, thus, it is not necessary to implement a polishing process as a post-treatment as in the semiconductor device manufacturing method in the prior art. Then, if a plurality of semiconductor elements are formed on the semiconductor element substrate 110, the semiconductor element substrate is cut into individual pieces of the required size so that they function as individual units of semiconductor devices.

Figure 2A:
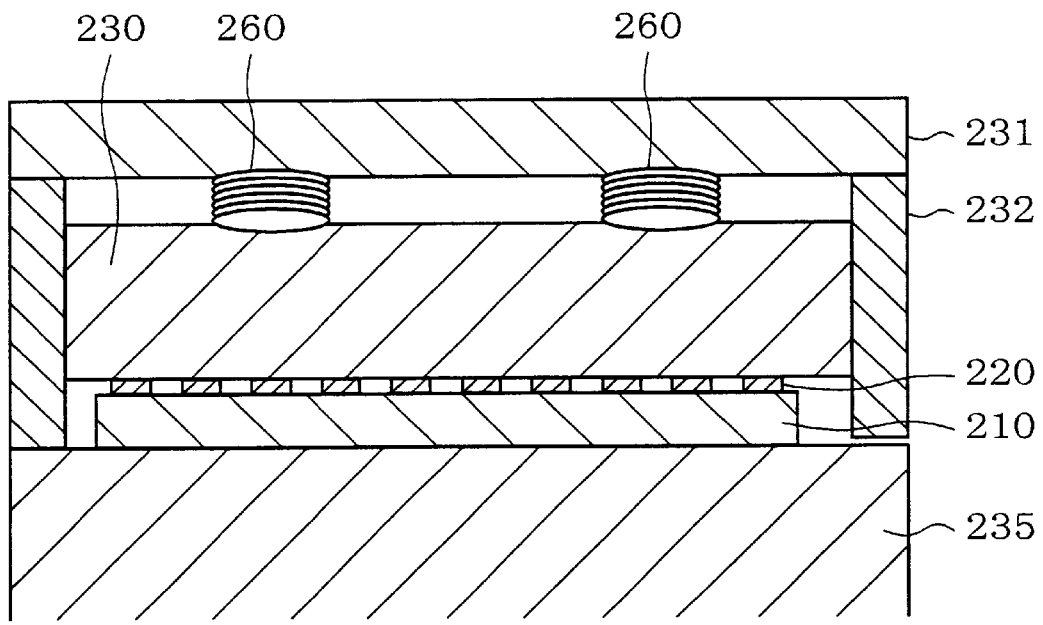
FIG. 2 illustrates the semiconductor device manufacturing method in a second embodiment.

In the semiconductor device manufacturing method in the embodiment, the tape 150 constituting the cushioning member is sandwiched between the semiconductor element substrate 110 and the lower die 135 to control the clamping force imparted by the mold die. As a result, even when the upper die 130 of the mold die is placed in close contact with the external terminals 120, the external terminals 120 do not become deformed and the semiconductor element is prevented from becoming damaged. Thus, the polishing process that is otherwise required to expose the external terminals 120 can be omitted, and an improvement in yield is achieved. Second Embodiment The semiconductor device manufacturing method in the second embodiment is explained in reference to FIG. 2. In the semiconductor device manufacturing method in this embodiment, the mold die illustrated in FIG. 2(A) is employed. An upper die 230 of the mold die is provided with a sliding mechanism that slides in relation to the direction of the height of the semiconductor element substrate 210.

The sliding mechanism at the upper die 230 of the mold die may be mainly constituted of a spring 260 constituting an elastic member that is provided to adjust the pressure applied to the semiconductor element substrate 210 by the upper die 230, a first supporting member 231 that supports the spring 260 from above and a second supporting member 232 that supports the upper die 230 from a side, as illustrated in FIG. 2(A), for instance.

A specific spring constant should be set for the spring to ensure that the upper die 230 can be placed in close contact with external terminals 220 without causing any deformation of the external terminals 220 or damage to the semiconductor element at the semiconductor element substrate 210 by assuming the most common substrate thickness, for instance.

While a structure in which the upper die 230 of the mold die is provided with a sliding mechanism is explained in reference to this embodiment, the present invention is not limited to this example. The present invention may be employed in a similar manner in a structure in which a sliding mechanism is provided at a lower die 235 instead of, or as well as, at the upper die 230.

Next, the semiconductor device manufacturing method that employs the mold die 210 described above is explained in reference to FIG. 2. As in the first embodiment, the external terminals 220 are formed as bumps on the semiconductor element substrate 210. This semiconductor element substrate 210 is placed on the upper surface of the lower die 235 of the mold die, as illustrated in FIG. 2(A).

In the embodiment, through the sliding mechanism described above, a mechanism for making adjustment along the direction of the height of the semiconductor element substrate 210 is provided in the mold die. As a result, even when the upper die 230 of the mold die is placed in close contact with the external terminals 220, the semiconductor element substrate 210 where the external terminals 220 are formed does not bear an excessively large load from the crimping force and, thus, the external terminals 220 do not become deformed and the semiconductor element is prevented from becoming damaged.

Figure 2B:
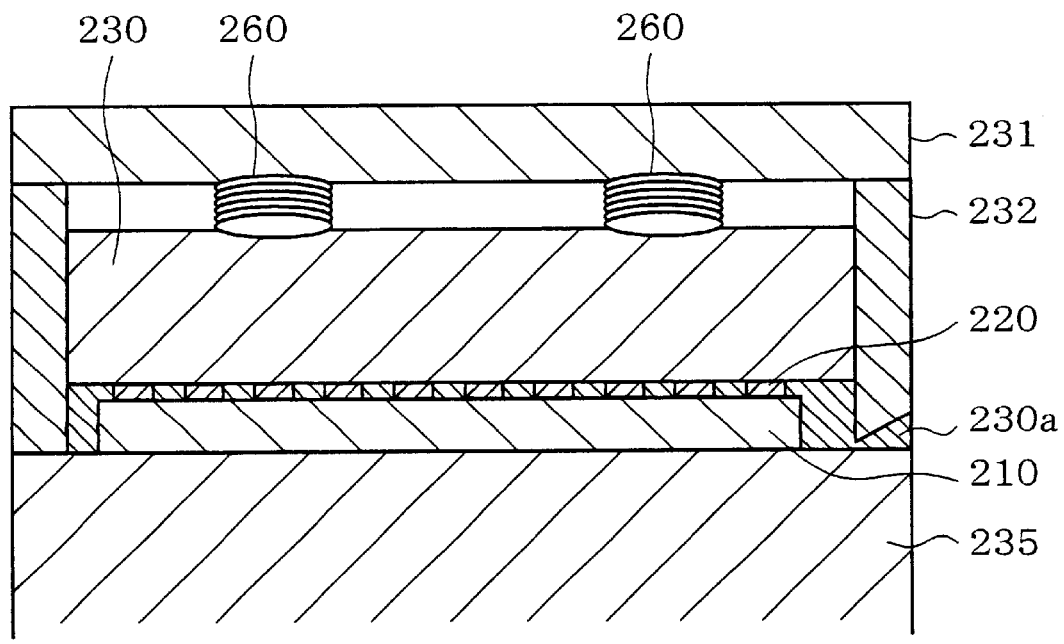

Next, as illustrated in FIG. 2(B), a sealing resin 240 is injected through a sealing resin intake 230a formed at a specific position of the mold die 230. At this point, since the upper die 230 is placed in close contact with the external terminals 220, the sealing resin 240 that is injected does not cover the upper portions of the external terminals 220.

At the semiconductor element substrate 210 taken out of the mold die when the resin sealing is completed, the upper portion of the external terminals 220 are not covered with resin and, thus, it is not necessary to implement a polishing process as a post-treatment as in the semiconductor device manufacturing method in the prior art. Then, if a plurality of semiconductor elements are formed on the semiconductor element substrate 210, the semiconductor element substrate is cut into individual pieces of the required size so that they function as individual units of semiconductor devices.

In the semiconductor device manufacturing method in the embodiment, by providing a sliding mechanism that slides in relation to the direction of the height of the semiconductor element substrate 210, the clamping force imparted by the mold die is controlled. As a result, even when the upper die 230 of the mold die is placed in close contact with the external terminals 220, the external terminals 220 do not become deformed and the semiconductor element is prevented from becoming damaged. Thus, the polishing process that is otherwise required to expose the external terminals 220 can be omitted, and an improvement in yield is achieved.

As has been explained, in the semiconductor device manufacturing method in the embodiment, the cushioning member is sandwiched between the semiconductor element substrate and the mold die to control the clamping force imparted by the mold die. As a result, even when the upper die of the mold die is placed in close contact with the external terminals, the external terminals do not become deformed and the semiconductor element is prevented from becoming damaged. Thus, the polishing process that is otherwise required to expose the external terminals can be omitted, and an improvement in yield is achieved.

In addition, in the semiconductor device manufacturing method according to the present invention, the mold die is caused to slide in relation to the height of the semiconductor element substrate to control the clamping force imparted by the mold die. As a result, even when the upper die of the mold die is placed in close contact with the external terminals, the external terminals do not become deformed and the semiconductor element is prevented from becoming damaged. Thus, the polishing process that is otherwise required to expose the external terminals can be omitted, and an improvement in yield is achieved.

Furthermore, by using the mold die according to the present invention with the cushioning member provided between the semiconductor element substrate and the mold die, the clamping force imparted by the mold die is controlled. As a result, even when the upper die of the mold die is placed in close contact with the external terminals, the external terminals do not become deformed and the semiconductor element is prevented from becoming damaged. Thus, the polishing process that is otherwise required to expose the external terminals can be omitted, and an improvement in yield is achieved.

Moreover, by using the other mold die according to the present invention provided with a sliding mechanism that slides in relation to the direction of the height of the semiconductor element substrate, the clamping force imparted by the mold die is controlled. As a result, even when the upper die of the mold die is placed in close contact with the external terminals, the external terminals do not become deformed and the semiconductor element is prevented from becoming damaged. Thus, the polishing process that is otherwise required to expose the external terminals can be omitted, and an improvement in yield is achieved.

While the invention has been particularly shown and described with respect to preferred embodiments of the semiconductor device manufacturing method and the mold die according to the present invention by referring to the attached drawings, the present invention is not limited to these examples and it will be understood by those skilled in the art that various changes in form and detail may be made therein without departing from the spirit, scope and teaching of the invention.

For instance, by mounting a cushioning member at the bottom surface of the semiconductor element substrate in advance, advantages that are essentially identical to those achieved in the first embodiment can be realized using a standard mold die. However, this method presents a problem in that the number of manufacturing steps is bound to increase since steps of mounting and detaching the cushioning member to and from the semiconductor element substrate must be implemented. In addition, the first embodiment is superior to this alternative method in which the cushioning member must be replaced or the like each time the resin sealing process is implemented.

While the explanation has been given in reference to the second embodiment on an example in which the upper die of the mold die is provided with a sliding mechanism and the upper die is caused to slide by the sliding mechanism to be placed in close contact with the external terminals, the present invention is not limited to this example. A sliding mechanism may be provided at the lower die instead of, or as well as, at the upper die so that the upper die is placed in close contact with the external terminals by causing the lower die to slide.

The entire disclosure of Japanese Patent Application No. 11-190758 filed on Jul. 5, 1999 including specification, claims, drawings and summary is incorporated herein by reference in its entirety.

What is claimed is:

1. A semiconductor device manufacturing method, comprising:
    providing a mold die having an upper die and a lower die;
    forming external terminals as bumps on an upper surface of a semiconductor element substrate;
    placing a cushioning member over an upper surface of the lower die;
    mounting the semiconductor element substrate on the cushioning member placed over the upper surface of the lower die, with a lower surface of the semiconductor element substrate being disposed to face the cushioning member, and the upper surface of the semiconductor element substrate being disposed to face the upper die;
    placing the upper die in close contact with the external terminals, the cushioning member preventing deformation of the external terminals during the close contact between the external terminals and the upper die;
    sealing the semiconductor element substrate in resin while the upper die is in close contact with the external terminals, while preventing an upper portion of the external terminals from being covered with the resin due to the close contact between the external terminals and the upper die; and
    after said sealing, separating the upper die from the external terminals so that the upper portions of the external terminals are free of the resin without performing a polishing operation.

2. A semiconductor device manufacturing method according to claim 1, further comprising selecting a material and a thickness of the cushioning member as appropriate in correspondence to a resistance required of the semiconductor element substrate and the external terminals to an external force.

3. A semiconductor device manufacturing method according to claim 1, wherein:
    said cushioning member is constituted of tape.

4. A semiconductor device manufacturing method, comprising:
    providing a mold die having a slidable upper die, and a stationary lower die;
    forming external terminals as bumps on an upper surface of a semiconductor element substrate;

placing an elastic member over the upper die;

mounting the semiconductor element substrate on an upper surface of the lower die, with a lower surface of the semiconductor element substrate being disposed to face the lower die, and the upper surface of the semiconductor element substrate being disposed to face the upper die;

placing the upper die in close contact with the external terminals by causing the upper die to slide toward the semiconductor element substrate, the elastic member preventing deformation of the external terminals during the close contact between the external terminals and the upper die;

sealing the semiconductor element substrate in resin while the upper die is in close contact with the external terminals, while preventing an upper portion of the external terminals from being covered with the resin due to the close contact between the external terminals and the upper die; and after said sealing, sliding the upper die away from the semiconductor element substrate so as to separate the upper die from the external terminals and so that the upper portions of the external terminals are free of the resin without performing a polishing operation.

5. A semiconductor device manufacturing method, comprising:

providing a mold die having an upper die, and a slidable lower die;

forming external terminals as bumps on an upper surface of a semiconductor element substrate;

placing an elastic member over the upper die;

mounting the semiconductor element substrate on an upper surface of the lower die, with a lower surface of the semiconductor element substrate being disposed to face the lower die, and the upper surface of the semiconductor element substrate being disposed to face the upper die;

placing the upper die in close contact with the external terminals by causing the lower die to slide toward the upper die, the elastic member preventing deformation of the external terminals during the close contact between the external terminals and the upper die;

sealing the semiconductor element substrate in resin while the upper die is in close contact with the external terminals, while preventing an upper portion of the external terminals from being covered with the resin due to the close contact between the external terminals and the upper die; and after said sealing, sliding the lower die away from the upper die so as to separate the upper die from the external terminals and so that the upper portions of the external terminals are free of the resin without performing a polishing operation.

6. A semiconductor device manufacturing method, comprising:

providing a mold die having a slidable upper die, and a slidable lower die;

forming external terminals as bumps on an upper surface of a semiconductor element substrate;

placing an elastic member over the upper die;

mounting the semiconductor element substrate on an upper surface of the lower die, with a lower surface of the semiconductor element substrate being disposed to face the lower die, and the upper surface of the semiconductor element substrate being disposed to face the upper die;

placing the upper die in close contact with the external terminals by causing the upper die and the lower die to slide toward each other, the elastic member preventing deformation of the external terminals during the close contact between the external terminals and the upper die;

sealing the semiconductor element substrate in resin while the upper die is in close contact with the external terminals, while preventing an upper portion of the external terminals from being covered with the resin due to the close contact between the external terminals and the upper die; and after said sealing, sliding the lower die and the upper die away from each other so as to separate the upper die from the external terminals and so that the upper portions of the external terminals are free of the resin without performing a polishing operation.

7. A mold die, comprising:

a movable upper die;

a stationary lower die; and a cushioning member disposed on said stationary die, said mold die being adapted to seal in resin a semiconductor element substrate having external terminals formed as bumps, said cushioning member absorbing a clamping force imparted by said upper die and said lower die over an area of an upper surface of said lower die where said semiconductor element substrate is mounted.

8. A mold die according to claim 7, wherein:

material constituting said cushioning member and a thickness of said cushioning member is selected as appropriate in correspondence to a resistance required of said semiconductor element substrate and said external terminals to an external force.

9. A mold die according to claim 7, wherein said cushioning member is constituted of tape.

* * * * *